(12) United States Patent
Degura

(10) Patent No.: US 12,160,647 B2
(45) Date of Patent: Dec. 3, 2024

(54) IMAGE CAPTURE APPARATUS AND CONTROL METHOD

(71) Applicant: CANON KABUSHIKI KAISHA, Tokyo (JP)

(72) Inventor: Yasusaburo Degura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 41 days.

(21) Appl. No.: 18/065,498

(22) Filed: Dec. 13, 2022

(65) Prior Publication Data

US 2023/0199290 A1 Jun. 22, 2023

(30) Foreign Application Priority Data

Dec. 17, 2021 (JP) .................. 2021-205460

(51) Int. Cl.
| | | |
|---|---|---|
| *H04N 23/52* | (2023.01) | |
| *G03B 17/02* | (2021.01) | |
| *G03B 17/55* | (2021.01) | |
| *H04N 23/57* | (2023.01) | |
| *H04N 23/60* | (2023.01) | |
| *H04N 23/65* | (2023.01) | |
| *H05K 7/20* | (2006.01) | |

(52) U.S. Cl.
CPC ............. *H04N 23/52* (2023.01); *G03B 17/02* (2013.01); *G03B 17/55* (2013.01); *H04N 23/57* (2023.01); *H04N 23/60* (2023.01); *H04N 23/65* (2023.01); *H04N 23/651* (2023.01); *H05K 7/20136* (2013.01); *H05K 7/20172* (2013.01); *H05K 7/20209* (2013.01)

(58) Field of Classification Search
CPC ........ H04N 23/52; H04N 23/57; H04N 23/60; H04N 23/65; H04N 23/651; G03B 17/02; G03B 17/55; G03B 17/56; G03B 2217/007; H05K 7/20209; H05K 7/20136; H05K 7/20172
See application file for complete search history.

(56) References Cited

U.S. PATENT DOCUMENTS

| | | | |
|---|---|---|---|
| 7,222,388 B2 * | 5/2007 | Sugihara | G03B 17/56 15/310 |
| 7,755,687 B2 * | 7/2010 | Fukushima | H04N 23/54 348/300 |
| 2016/0295095 A1 * | 10/2016 | Jannard | H05K 7/20172 |
| 2019/0154949 A1 * | 5/2019 | Hosoe | G05D 23/1919 |
| 2020/0120250 A1 * | 4/2020 | Colin | H05K 7/20145 |

(Continued)

FOREIGN PATENT DOCUMENTS

| | | | |
|---|---|---|---|
| JP | 2000228736 A | 8/2000 | |
| JP | 2006033031 A * | 2/2006 | ............. F25B 21/02 |

(Continued)

*Primary Examiner* — Twyler L Haskins
*Assistant Examiner* — Akshay Trehan
(74) *Attorney, Agent, or Firm* — Canon U.S.A., Inc. IP Division

(57) ABSTRACT

An image capture apparatus comprises a connection unit that connects a cooling device, a detection unit that detects that the cooling device is connected, and a control unit that, when the cooling device is connected to the image capture apparatus, controls power for driving the cooling device based on a power control method for driving the cooling device and an operational state of the image capture apparatus.

19 Claims, 6 Drawing Sheets

(56) References Cited

U.S. PATENT DOCUMENTS

2020/0264493 A1* 8/2020 Ichihara ................. G03B 15/05
2020/0344922 A1* 10/2020 Wada ................. H05K 7/20172

FOREIGN PATENT DOCUMENTS

| JP | 2006103160 A | | 4/2006 | | |
|----|--------------|---|--------|---|---|
| JP | 2007110300 A | | 4/2007 | | |
| JP | 2009117961 A | | 5/2009 | | |
| JP | 2013175959 A | * | 9/2013 | ............. | G03B 17/02 |
| JP | 2019102997 A | * | 6/2019 | ............. | G02B 7/028 |
| JP | 2019114893 A | | 7/2019 | | |
| JP | 2019191433 A | * | 10/2019 | ............. | G03B 13/02 |

* cited by examiner

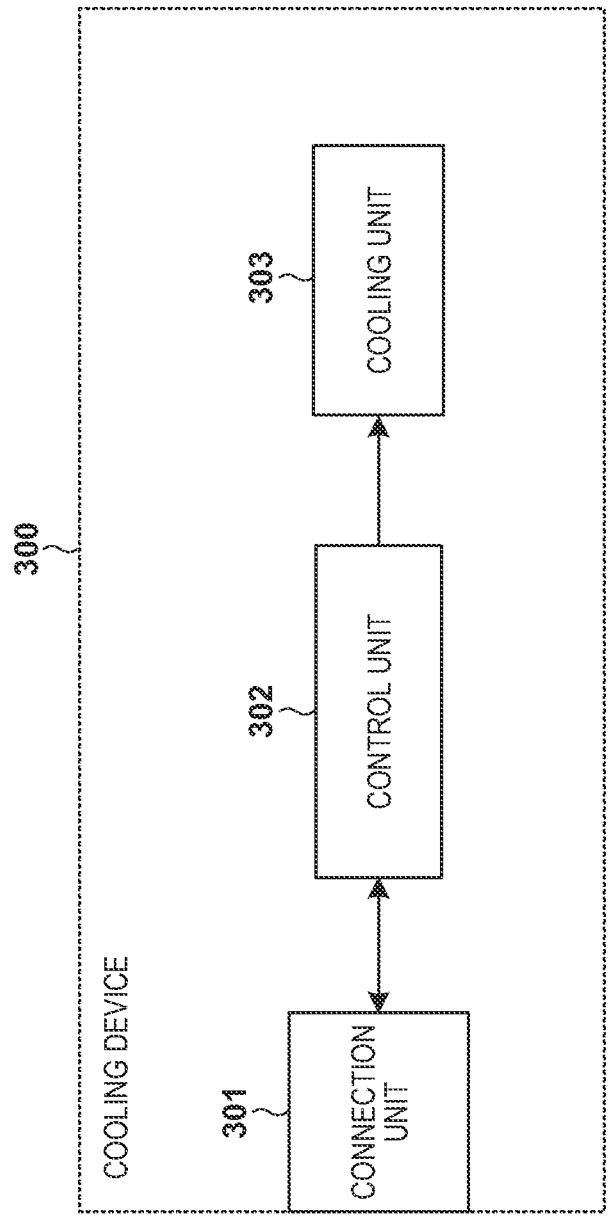

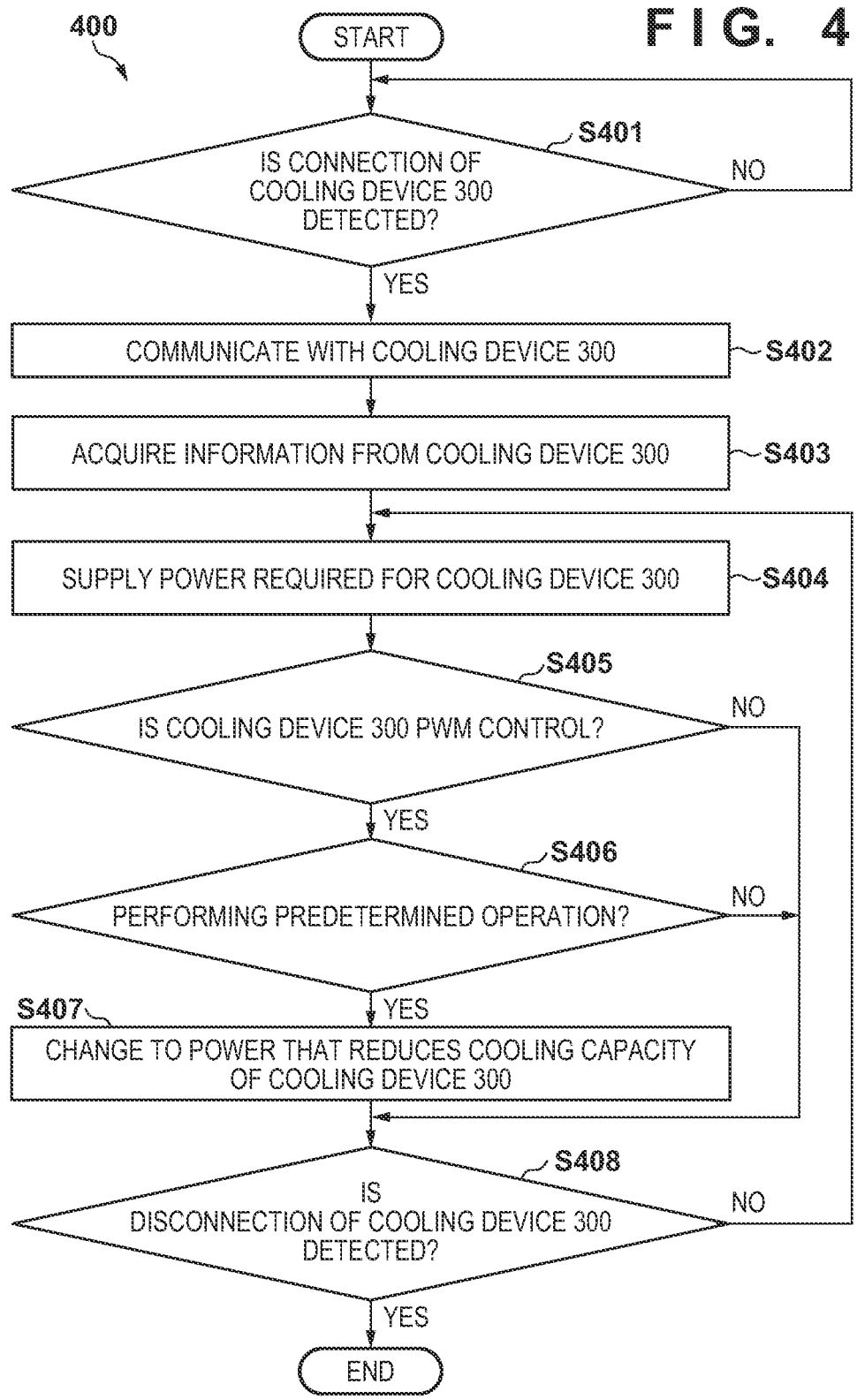

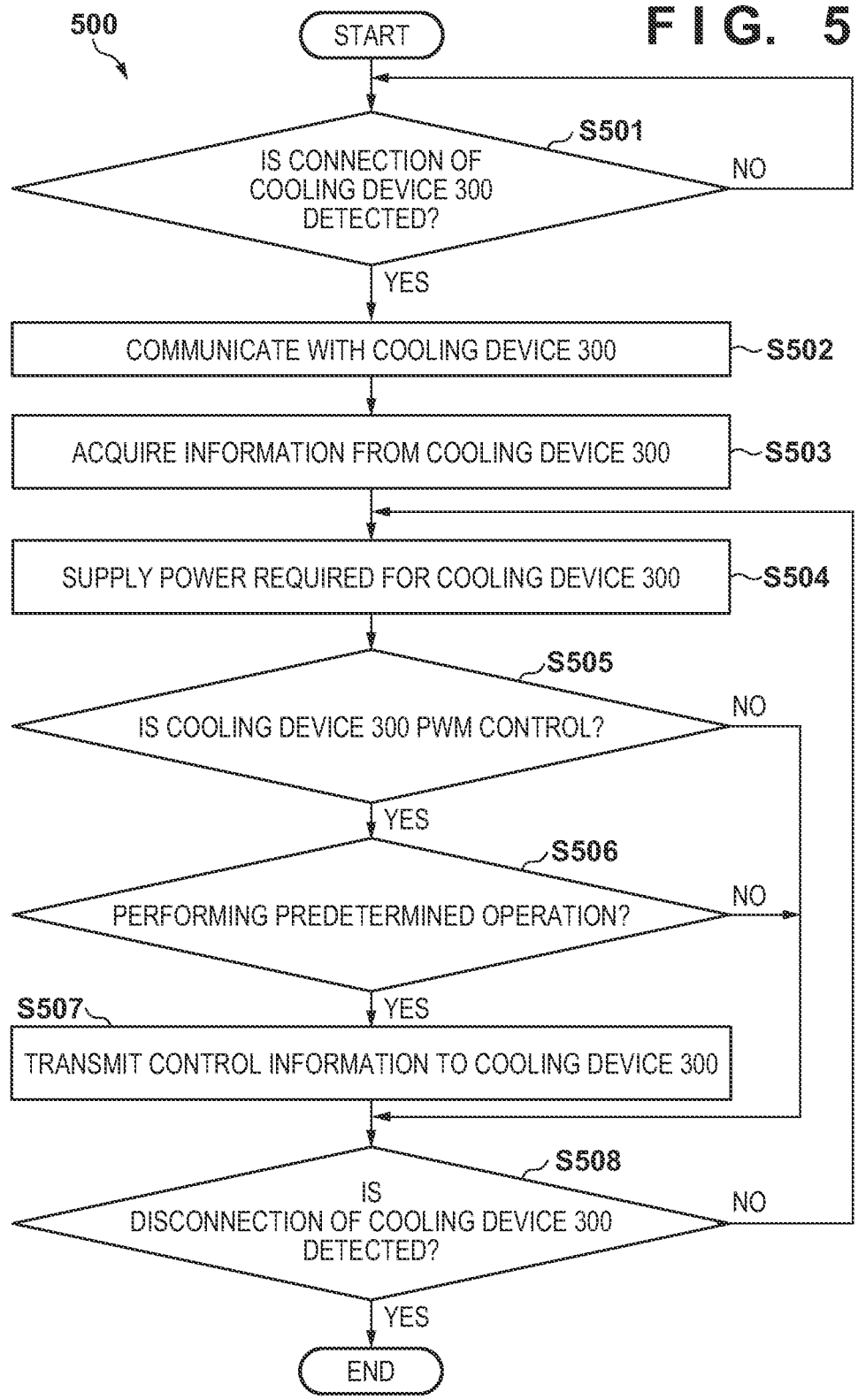

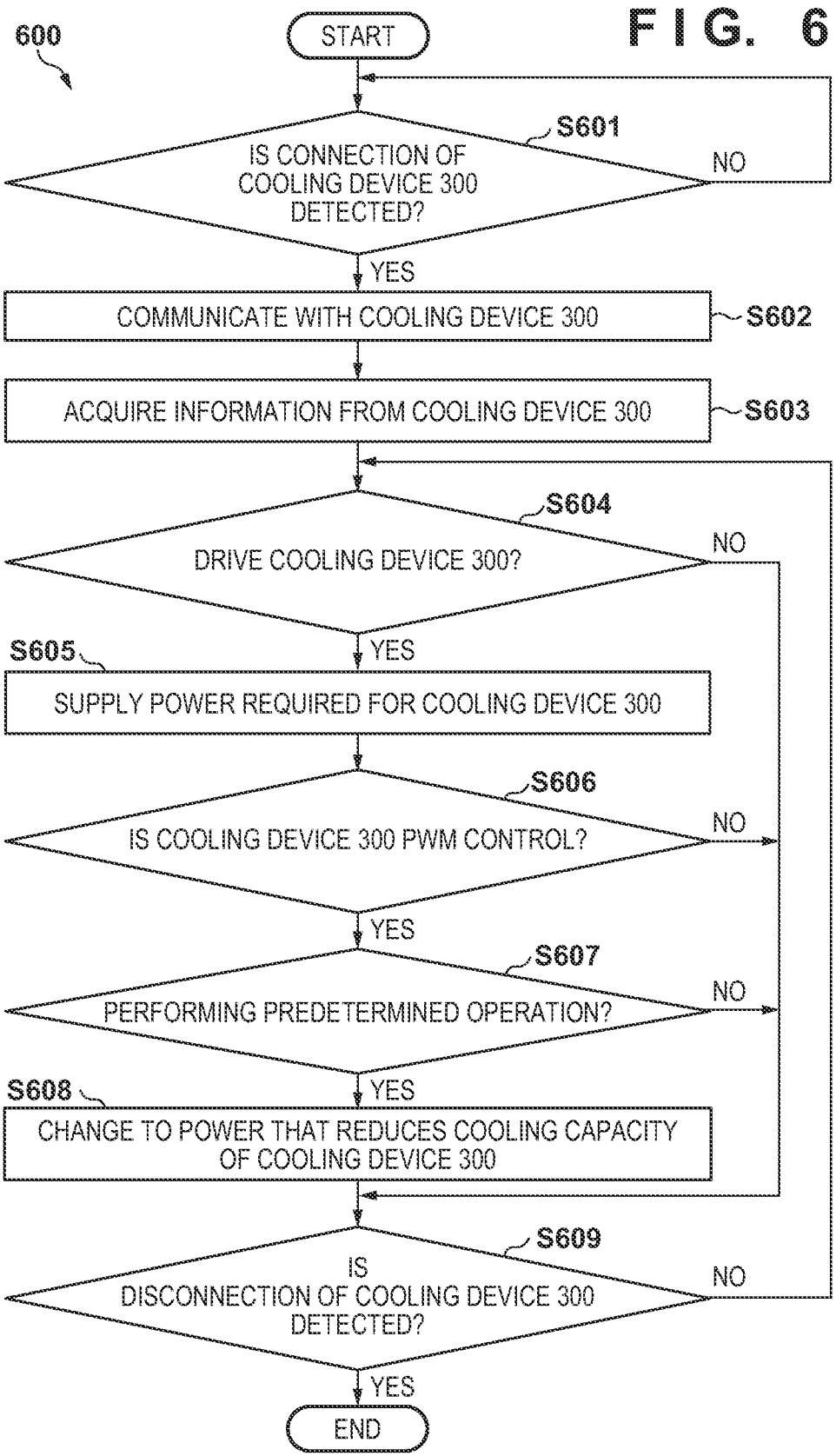

IMAGE CAPTURE APPARATUS AND CONTROL METHOD

BACKGROUND OF THE INVENTION

Field of the Invention

The present invention relates to an image capture apparatus to which a cooling device can be connected, and a method of controlling the image capture apparatus.

Description of the Related Art

In image sensors such as Charge-coupled Device (CCD) or Metal Oxide Semiconductor (MOS) sensors, dark current noise occurs due to heat generation of the image sensor or an increase in ambient temperature. Because dark current noise may cause a degradation of image quality, a method is employed for reducing dark current noise by cooling the inside of the device using a cooling device such as a Peltier element or a fan, for example.

Here, the cooling capacity (temperature regulation) of the cooling device is exerted by controlling power for driving the cooling device. As power control methods for driving a cooling device, direct-current control (DC control) of linearly changing a voltage to be applied to the cooling device, and pulse width modulation control (PWM control) of changing a period in which a voltage is applied to the cooling device using pulse width modulation (PWM) are known.

Japanese Patent Laid-Open No. 2007-110300 discloses a method in which a cooling device is driven using DC control when the operation mode of an image capture apparatus is a mode where a priority is given to image quality, and the cooling device is driven using PWM control when the operation mode is a mode where no priority is given to image quality.

However, Japanese Patent Laid-Open No. 2007-110300 does not disclose a method for controlling power for driving a cooling device, based on an operational state of an image capture apparatus and a power control method of the cooling device.

SUMMARY OF THE INVENTION

The present invention has been made in consideration of the aforementioned problems, and enables control of power for driving a cooling device based on an operational state of an image capture apparatus and a power control method of the cooling device.

In order to solve the aforementioned problems, the present invention provides an image capture apparatus comprising: a connection unit that connects a cooling device; a detection unit that detects that the cooling device is connected; and a control unit that, when the cooling device is connected to the image capture apparatus, controls power for driving the cooling device based on a power control method for driving the cooling device and an operational state of the image capture apparatus.

In order to solve the aforementioned problems, the present invention provides a method of controlling an image capture apparatus to which a cooling device can be connected, comprising: detecting that the cooling device is connected; and controlling, when the cooling device is connected to the image capture apparatus, power for driving the cooling device based on a power control method for driving the cooling device and an operational state of the image capture apparatus.

In order to solve the aforementioned problems, the present invention provides a non-transitory computer-readable storage medium storing a program that causes a computer to execute a method of controlling an image capture apparatus to which a cooling device can be connected, comprising: detecting that the cooling device is connected; and controlling, when the cooling device is connected to the image capture apparatus, power for driving the cooling device based on a power control method for driving the cooling device and an operational state of the image capture apparatus.

According to the present invention, it is possible to control power for driving a cooling device, based on an operational state of an image capture apparatus and a power control method of the cooling device.

Further features of the present invention will become apparent from the following description of exemplary embodiments (with reference to the attached drawings).

BRIEF DESCRIPTION OF THE DRAWINGS

FIG. 3 is a block diagram illustrating components of the cooling device 300 according to the first embodiment.

FIG. 4 is a flowchart illustrating processing 400 that is executed in the image capture apparatus 100 according to the first embodiment.

FIG. 5 is a flowchart illustrating processing 500 that is executed in the image capture apparatus 100 according to the second embodiment.

FIG. 6 is a flowchart illustrating processing 600 that is executed in the image capture apparatus 100 according to the third embodiment.

DESCRIPTION OF THE EMBODIMENTS

Figure 1:
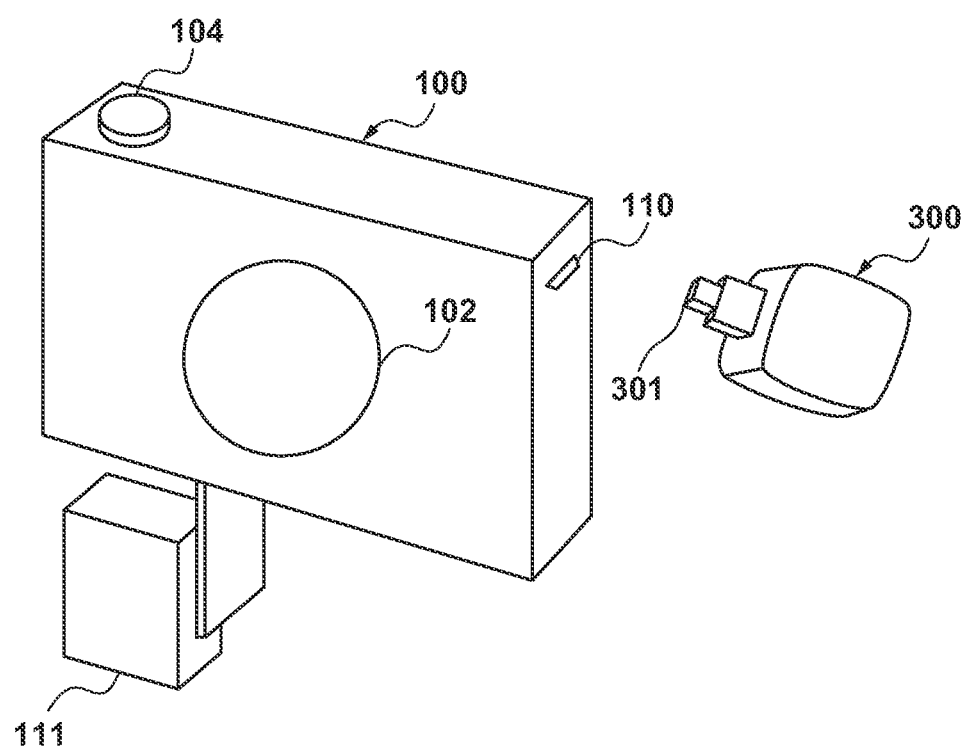
FIG. 1 is a diagram illustrating examples of exterior configurations of an image capture apparatus 100 and a cooling device 300 according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

FIG. 1 is a diagram illustrating examples of exterior configurations of an image capture apparatus 100 and a cooling device 300 according to the first embodiment.

The first embodiment describes an example in which the image capture apparatus 100 is a digital camera, but the image capture apparatus 100 is not limited to a digital camera, and may be an electronic device such as a smartphone or a tablet device to which the cooling device 300 can be connected.

As shown in FIG. 1, the image capture apparatus 100 includes an operation unit 104, an image capturing unit 105, and a connection unit 110. The image capture apparatus 100, to which a battery 111 can be connected, can be operated by electric power supplied from the battery 111. An accessory device can be connected to the connection unit 110 of the image capture apparatus 100. The accessory device is, for example, the cooling device 300, but is not limited to this, and an external device such as a battery grip can be connected to the image capture apparatus 100.

The cooling device 300 includes a connection unit 301 that can be connected to the connection unit 110 of the image capture apparatus 100.

The cooling device 300 is supplied with power from the battery 111 connected to the image capture apparatus 100 in a state in which the connection unit 301 is connected to the connection unit 110 of the image capture apparatus 100, and can cool a predetermined position inside the image capture apparatus 100. For example, a circuit board on which a heat source such as an image sensor is mounted is arranged at the predetermined position. Note that the cooling device 300 can be directly attached to the housing of the image capture apparatus 100 so as to be able to cool the predetermined position inside the image capture apparatus 100 from the outside of the image capture apparatus 100.

When the connection unit 110 of the image capture apparatus 100 and the connection unit 301 of the cooling device 300 are both USB interfaces conforming to the USB standard, the image capture apparatus 100 serves as a Host, and the cooling device 300 serves as a Device. When the connection unit 110 and the connection unit 301 are both USB interfaces, the connection unit 110 and the connection unit 301 can communicate with each other, and power supply from the connection unit 110 to the connection unit 301 is also possible. Note that a configuration is also possible in which the connection unit 110 and the connection unit 301 can wirelessly communicate with each other, and wireless power supply from the connection unit 110 to the connection unit 301 is possible.

Figure 2:
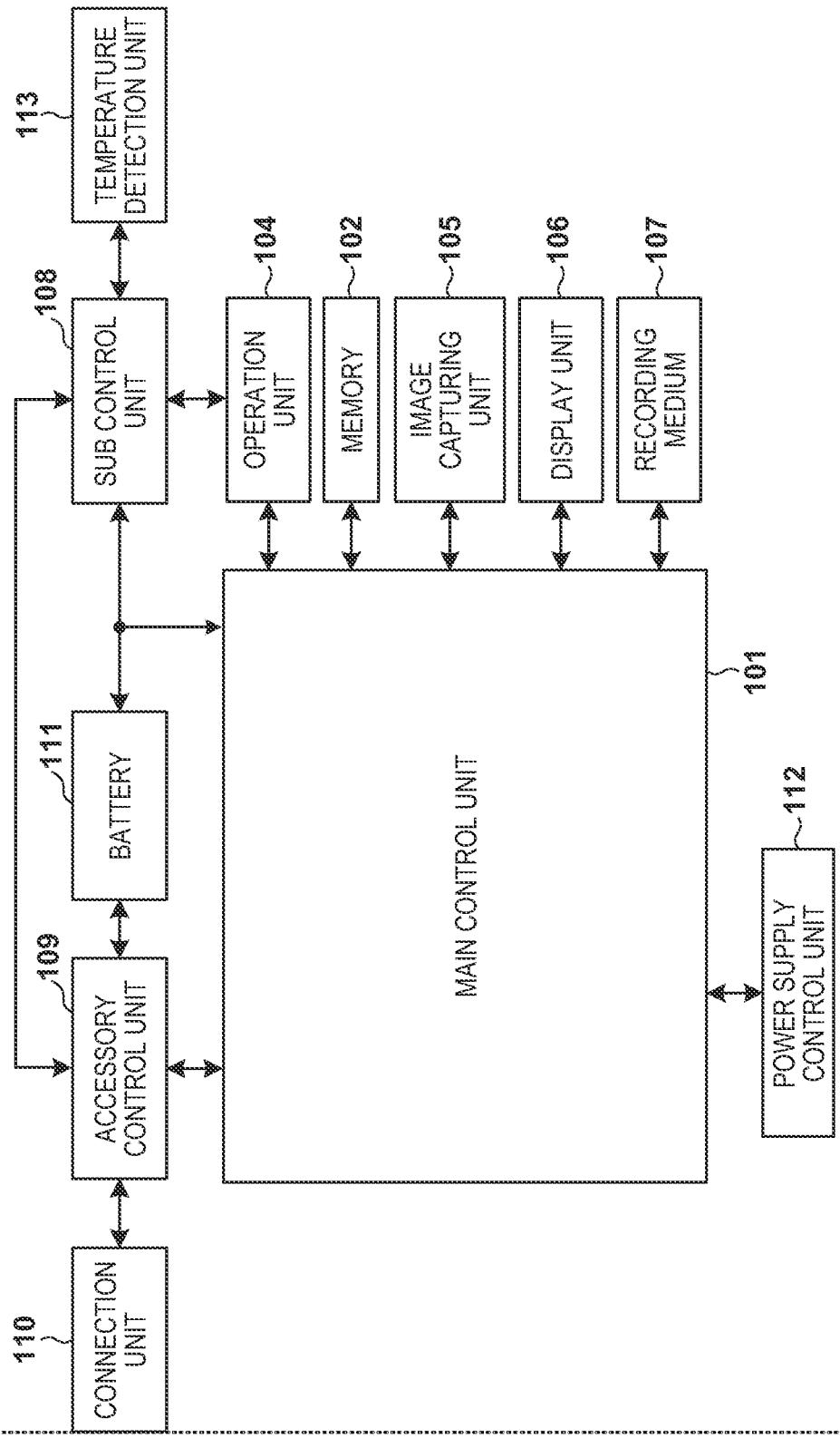
FIG. 2 is a block diagram illustrating components of the image capture apparatus 100 according to the first embodiment.

FIG. 2 is a block diagram illustrating components of the image capture apparatus 100 according to the first embodiment.

A main control unit 101 includes a memory in which programs for controlling the components of the image capture apparatus 100 are stored, and a computer (e.g., microprocessor) that executes the programs to control the components of the image capture apparatus 100. By executing the programs, the main control unit 101 can control pieces of processing 400, 500, and 600, which will be described later.

A memory 102 is a memory for temporarily storing image data captured by the later-described image capturing unit 105.

The operation unit 104 is an operation member that accepts various user operations. A user can operate the operation unit 104 to turn on or off a power switch of the image capture apparatus 100, or display a menu screen on a display unit 106. The user can also operate the operation unit 104 to change the operation mode of the image capture apparatus 100, instruct the image capture apparatus 100 to prepare for shooting, or instruct the image capture apparatus 100 to shoot an image, for example. The operation unit 104 includes a touch sensor that can detect a touch operation given to the later-described display unit 106. The operation unit 104 outputs operation information in accordance with a user operation to the main control unit 101 or a sub control unit 108.

When a shutter button included in the operation unit 104 is being pressed half-way, a shooting preparation instruction (shutter switch signal SW1 ON) is input to the main control unit 101 from the operation unit 104. Upon receiving the shooting preparation instruction, the main control unit 101 starts, based on image data at the time of the reception of the shooting preparation instruction, automatic focus (AF) processing, automatic exposure (AE) processing, white balance (WB) processing, flash pre-emission (EF) processing, or the like.

When the shutter button included in the operation unit 104 is pressed fully, a shooting instruction (shutter switch signal SW2 ON) is input to the main control unit 101 from the operation unit 104. Upon receiving the shooting instruction, the main control unit 101 starts a series of shooting processing from reading image signals from the later-described image capturing unit 105 to writing image data as an image file into a recording medium 107.

The image capturing unit 105 includes an image sensor such as a CCD or a CMOS that converts an object image into electric signals, and an A/D converter that converts analog signals output from the image sensor into digital signals. The image capturing unit 105 converts object image light formed by a not-shown optical system into electric signals using the image sensor, performs noise reduction processing or the like thereon, and outputs the resultant image data.

The display unit 106 displays a live view image during shooting, a shot image, text for interactive operation, and the like. The display unit 106 is a display device such as a liquid crystal display or an organic EL display, for example. The display unit 106 may be configured to be integrated with the image capture apparatus 100, or may be configured as an external device connected to the image capture apparatus 100. It is sufficient that the image capture apparatus 100 can be connected to the display unit 106, and has a function of controlling display of the display unit 106.

The main control unit 101 performs image processing such as resizing processing or color conversion processing on image signals read out from the image capturing unit 105 so as to generate image data. Also, the main control unit 101 subjects the image data to compression coding or encoding in a predetermined format to generate an image file, and records the generated image file in the later-described recording medium 107.

The recording medium 107 may be a memory card or a hard disk drive that can be attached to the image capture apparatus 100, or a flash memory or a hard disk drive that is built in the image capture apparatus 100. It is sufficient that the image capture apparatus 100 is at least accessible to the recording medium 107.

The sub control unit 108 has a microcomputer that includes: a processor (e.g., CPU) that controls some of the components of the image capture apparatus 100; and a memory. The sub control unit 108 is configured to be operable with a power consumption lower than that of the main control unit 101. The sub control unit 108 is configured to be able to communicate with the main control unit 101, and control a later-described accessory control unit 109.

The sub control unit 108 outputs, to the accessory control unit 109, operation information indicating the operational state of the image capture apparatus 100, and temperature information indicating the temperature of the image capture apparatus 100.

The accessory control unit 109 can communicate with the sub control unit 108. The accessory control unit 109 performs processing for variably controlling the cooling capacity of a cooling unit 303 of the cooling device 300, based on a power control method of the cooling device 300 connected to the image capture apparatus 100, and the operation information of the image capture apparatus 100 acquired from the sub control unit 108. By controlling power for driving the cooling device 300, the accessory control unit 109 variably controls the cooling capacity of the cooling unit 303 of the cooling device 300. Note that the present invention is not limited to the configuration in which the sub control unit 108 acquires operation information of the image capture apparatus 100, and a configuration is also possible in which the main control unit 101 or the accessory control unit 109 acquires operation information of the image capture apparatus 100.

The power control method of the cooling device 300 refers to a method of controlling power for driving the cooling unit 303 of the cooling device 300. The power control method of the cooling device 300 includes, for example, direct-current control (DC control) of linearly changing a voltage to be applied to the cooling device, and pulse width modulation control (PWM control) of changing a period in which a voltage is applied to the cooling device (effective voltage) based on pulse width modulation (PWM).

The connection unit 110 is an interface for communicably connecting to the cooling device 300. The connection unit 110 is a Universal Serial Bus (USB) interface, for example. The image capture apparatus 100 can communicate with the cooling device 300 via the connection unit 110. Also, the image capture apparatus 100 supplies power of the battery 111 to the cooling device 300 via the connection unit 110. The connection unit 110 may be configured to be connected to the connection unit 301 directly, or may be configured to be connected to the connection unit 301 via a cable.

The battery 111 is a rechargeable battery such as a NiCd battery, a NiMH battery, or a lithium-ion battery. The battery 111 supplies power to the components of the image capture apparatus 100, and supplies power for driving the cooling device 300 via the connection unit 110.

A power supply control unit 112 is controlled by the main control unit 101, and controls power to be supplied from the battery 111 to the components of the image capture apparatus 100.

A temperature detection unit 113 is a temperature sensor that acquires information relating to a temperature at a predetermined position of the image capture apparatus 100. The temperature detection unit 113 outputs the temperature information of the image capture apparatus 100 to the sub control unit 108. The sub control unit 108 outputs the temperature information acquired from the temperature detection unit 113 to the accessory control unit 109.

FIG. 3 is a block illustrating components of the cooling device 300 to be connected to the image capture apparatus 100.

The cooling device 300 includes the connection unit 301, a control unit 302, and the cooling unit 303.

The connection unit 301 is an interface for connecting to the image capture apparatus 100. The connection unit 301 is a Universal Serial Bus (USB) interface, for example. The cooling device 300 can communicate with the image capture apparatus 100 via the connection unit 301. Also, the cooling device 300 is supplied with power from the image capture apparatus 100 via the connection unit 301. The connection unit 301 may be configured to be connected to the connection unit 110 directly, or may be configured to be connected to the connection unit 110 via a cable. Note that the cooling device 300 may not only have a configuration in which the cooling device 300 is supplied with power from the image capture apparatus 100 via the connection unit 301, but also have a configuration in which the cooling device 300 is supplied with power from a battery or an external power source.

The control unit 302 controls power to be supplied to the cooling unit 303 of the cooling device 300, based on information received from the accessory control unit 109 of the image capture apparatus 100 via the connection unit 301.

The cooling unit 303 includes, for example, a Peltier element and/or a fan. The control unit 302 can variably control the cooling capacity of the cooling unit 303 using power for driving the cooling unit 303. When the control unit 302 is a Peltier element, the cooling capacity of the cooling unit 303 corresponds to the amount of heat absorption of the Peltier element. When the control unit 302 is a fan, the cooling capacity of the cooling unit 303 corresponds to the number of rotations of the fan.

The accessory control unit 109 detects that the cooling device 300 is connected to the connection unit 110 of the image capture apparatus 100. The accessory control unit 109 can detect that the connection unit 301 of the cooling device 300 is connected to the connection unit 110 of the image capture apparatus 100, with reference to voltage information relating to a voltage at a predetermined terminal of the connection unit 110. For example, upon detecting a change in voltage at a first terminal of the connection unit 110 from a predetermined voltage to 0V, the accessory control unit 109 can detect that the connection unit 301 of the cooling device 300 is connected to the connection unit 110 of the image capture apparatus 100.

Also, the accessory control unit 109 communicates with the cooling device 300 via the connection unit 110 to acquire information such as a power control method from the cooling device 300. Upon being connected to the connection unit 110 of the image capture apparatus 100, the cooling device 300 is supplied with power from the image capture apparatus 100, and transmits information relating to the cooling device 300 to the image capture apparatus 100 via the connection unit 301. The accessory control unit 109 can determine the power control method of the cooling device 300 based on the information received from the cooling device 300 via the connection unit 110. Note that the accessory control unit 109 may acquire information relating to the cooling device 300 with reference to information relating to a voltage at a predetermined terminal of the connection unit 110. For example, in a configuration in which when the cooling device 300 is connected, a voltage at a second terminal of the connection unit 110 varies depending on the power control method of the cooling device 300, the accessory control unit 109 can acquire the power control method of the cooling device 300 connected to the image capture apparatus 100 with reference to information relating to a voltage at the second terminal.

Furthermore, the accessory control unit 109 supplies the cooling device 300 with power for driving the cooling unit 303 of the cooling device 300, based on the power control method of the cooling device 300 connected to the connection unit 110. The accessory control unit 109 supplies, for example, power required for DC control or power required for PWM control for the cooling unit 303 of the cooling device 300, based on the power control method of the cooling device 300. The control unit 302 of the cooling device 300 drives the cooling unit 303 using power supplied from the accessory control unit 109 of the image capture apparatus 100. The accessory control unit 109 can variably control the cooling capacity of the cooling unit 303 by changing power to be supplied to the cooling device 300.

Also, the accessory control unit 109 reduces the power for driving the cooling unit 303 and supplies the reduced power to the cooling device 300, in order to reduce the cooling capacity of the cooling unit 303, based on operation information of the image capture apparatus 100, for example. The control unit 302 of the cooling device 300 drives the cooling unit 303 using the power supplied from the accessory control unit 109 of the image capture apparatus 100. The accessory control unit 109 can variably control the cooling capacity of the cooling unit 303 by changing power to be supplied to the cooling device 300.

Note that the present invention is not limited to the configuration in which the accessory control unit 109 controls power to be supplied to the cooling device 300 based on the power control method of the cooling device 300 and the operation of the image capture apparatus 100, and a configuration is also possible in which the main control unit 101 controls power to be supplied to the cooling device 300.

The following will describe the processing 400 that is executed in the image capture apparatus 100 according to the first embodiment, with reference to the flowchart shown in FIG. 4. The processing 400 is an example of processing for controlling the cooling device 300 connected to the image capture apparatus 100. In the processing 400, control is performed by the main control unit 101 executing a program stored in the memory of the main control unit 101. Note that FIG. 4 illustrates an example in which the power control method of the cooling device 300 is DC control or PWM control.

In step S401, the accessory control unit 109 detects that the cooling device 300 is connected to the connection unit 110 of the image capture apparatus 100. The accessory control unit 109 repeats the processing in step S401 until it detects that the cooling device 300 is connected to the connection unit 110 of the image capture apparatus 100. Upon detecting that the cooling device 300 is connected to the connection unit 110 of the image capture apparatus 100, the accessory control unit 109 advances the processing 400 to step S402.

In step S402, the accessory control unit 109 communicates with the cooling device 300 via the connection unit 110, and advances the processing 400 to step S403.

In step S403, the accessory control unit 109 acquires information such as a power control method from the cooling device 300 via the connection unit 110, and advances the processing 400 to step S404.

In step S404, the accessory control unit 109 supplies power to the cooling device 300 based on the power control method of the cooling device 300 acquired in step S402, and advances the processing 400 to step S405. When the power control method of the cooling device 300 is PWM control, the accessory control unit 109 supplies, to the cooling device 300, first power for driving the cooling unit 303 of the cooling device 300 using PWM control. When the power control method of the cooling device 300 is DC control, the accessory control unit 109 supplies, to the cooling device 300, third power for driving the cooling unit 303 of the cooling device 300 using DC control.

In step S405, the accessory control unit 109 determines whether or not the power control method of the cooling device 300 is PWM control in step S404. When the accessory control unit 109 determines that the power control method of the cooling device 300 is PWM control, the accessory control unit 109 advances the processing 400 to step S406. When the accessory control unit 109 determines that the power control method of the cooling device 300 is not PWM control (but DC control), the accessory control unit 109 advances the processing 400 to step S408.

In step S406, the accessory control unit 109 determines whether or not the image capture apparatus 100 is performing a predetermined operation, based on operation information of the image capture apparatus 100 acquired from the sub control unit 108. A predetermined operation is an operation of reading image signals from the image capturing unit 105, for example. When the accessory control unit 109 determines that the image capture apparatus 100 is performing a predetermined operation, the accessory control unit 109 advances the processing 400 to step S407. When the accessory control unit 109 determines that the image capture apparatus 100 is not performing a predetermined operation, the accessory control unit 109 advances the processing 400 to step S408. An operation other than the predetermined operation is, for example, an exposure operation.

In step S407, the accessory control unit 109 changes the first power supplied to the cooling device 300 in step S404 to second power, which is smaller than the first power, and supplies the second power to the cooling device 300, and advances the processing 400 to step S408. This reduces a variation in magnetic field generated when the cooling unit 303 of the cooling device 300 is driven by PWM control, making it possible to reduce the effect of magnetic field noise of the image capturing unit 105 on the image quality. Note that there is a relationship such that the first power in PWM control is greater than the third power in DC control, and the third power in DC control is greater than the second power in PWM control (first power>third power>second power).

In step S408, the accessory control unit 109 determines whether or not the cooling device 300 is disconnected from the connection unit 110 of the image capture apparatus 100. When the accessory control unit 109 determines that the cooling device 300 is disconnected from the connection unit 110 of the image capture apparatus 100, the accessory control unit 109 ends the processing 400. When the accessory control unit 109 determines that the cooling device 300 is not disconnected from the connection unit 110 of the image capture apparatus 100, the accessory control unit 109 returns the processing 400 to step S404, and continues to supply power to the cooling device 300.

Note that when no information can be acquired from the cooling device 300 in step S403, the accessory control unit 109 may stop supplying power to the cooling device 300 and end the processing 400. Also when it is not possible to determine the power control method of the cooling device 300 in step S404, the accessory control unit 109 may stop supplying power to the cooling device 300 and end the processing 400.

Although as an example of the predetermined operation in step S406, an operation of reading image signals from the image capturing unit 105 has been given, the present invention is not limited to this, and a configuration is also possible in which the processing always advances to step S407 while an operation that corresponds to the shooting instruction (shutter switch signal SW2 ON) is being performed.

Although in step S407, the second power, which is smaller than the first power, is supplied, the present invention is not limited to this, and a control may also be possible in which no power is supplied.

As described above, according to the first embodiment, it is possible to control power to be supplied to the cooling device 300, based on the control method of the cooling device 300 connected to the connection unit 110 and the operational state of the image capture apparatus 100. Also, in a case where the power control method of the cooling device 300 is PWM control, when the image capturing unit 105 of the image capture apparatus 100 is performing an operation that is susceptible to a variation in magnetic field, it is possible to control power to be supplied to the cooling device 300 so that the cooling capacity of the cooling device 300 is reduced. With this, it is possible to cool the image capture apparatus 100 while reducing the effect on the image quality.

Second Embodiment

The first embodiment has described an example in which the image capture apparatus 100 determines power for driving the cooling device 300 based on the operation information of the image capture apparatus 100 and the power control method of the cooling device 300, and supplies the determined power to the cooling device 300. In contrast, the second embodiment describes an example in which the image capture apparatus 100 transmits control information to the cooling device 300, and the cooling device 300 controls power to be supplied to the cooling unit 303 based on the control information received from the image capture apparatus 100.

The accessory control unit 109 transmits, to the cooling device 300, control information to be used for the control unit 302 of the cooling device 300 to change power for driving the cooling unit 303 based on the operation information of the image capture apparatus 100. Control information refers to information for instructing the control unit 302 of the cooling device 300 to reduce the power for driving the cooling unit 303 (reduce the cooling capacity), for example. Based on the control information, the control unit 302 of the cooling device 300 performs control such that power for driving the cooling unit 303 is reduced. The accessory control unit 109 can variably control the cooling capacity of the cooling unit 303 by transmitting, to the cooling device 300, control information for changing power for driving the cooling unit 303.

Note that the present invention is not limited to the configuration in which the accessory control unit 109 controls the cooling device 300, and a configuration is also possible in which the main control unit 101 or the accessory control unit 109 controls the cooling device 300.

The configurations of the image capture apparatus 100 and the cooling device 300 are the same as those of the first embodiment.

The following will describe the processing 500 that is executed in the image capture apparatus 100 according to the second embodiment, with reference to the flowchart of FIG. 5. The processing 500 is an example of processing for controlling the cooling device 300 connected to the image capture apparatus 100. In the processing 500, control is performed by the main control unit 101 executing a program stored in the memory of the main control unit 101. Note that FIG. 5 illustrates an example in which the power control method of the cooling device 300 is DC control or PWM control.

In the processing 500 in FIG. 5, the processing in steps S501 to S506 and S508 are the same as the processing in steps S401 to S406 and S408 of the processing 400 in FIG. 4. Accordingly, in the second embodiment, descriptions of steps S501 to S506 and S508 are omitted.

In step S507, the accessory control unit 109 transmits control information for causing the cooling device 300 to reduce power to be supplied to the cooling unit 303, and advances the processing 500 to step S508. The control unit 302 of the cooling device 300 reduces power to be supplied to the cooling unit 303, in accordance with the control information received from the accessory control unit 109. The control information refers to information for instructing the control unit 302 of the cooling device 300 to change the first power supplied to the cooling device 300 in step S504 to the second power, which is smaller than the first power, and supply the second power to the cooling unit 303.

Note that, for example, by changing the value of a voltage to be applied to a control terminal of the connection unit 110 of the image capture apparatus 100, the accessory control unit 109 may transmit information for causing the control unit 302 of the cooling device 300 to reduce power for driving the cooling unit 303.

In step S504, the accessory control unit 109 may also supply power required by the cooling device 300, regardless of the power control method of the cooling device 300. In this case, for example, the control information to be transmitted from the image capture apparatus 100 may be information indicating one of the levels "strong", "weak", and "stop" of driving the cooling unit 303.

When no information can be acquired from the cooling device 300 in step S503, the accessory control unit 109 may transmit control information for stopping power supply to the cooling device 300. Also, when it is not possible to determine the power control method of the cooling device 300 in step S504, the accessory control unit 109 may transmit control information for stopping power supply to the cooling device 300 in step S507.

It is also possible to execute the processing in step S406 in FIG. 4 before the processing in step S507, and based on the determination result, control whether to stop driving the cooling unit 303 in step S507.

When the cooling device 300 is configured to be supplied with power from a battery or an external power source, the processing in step S504 may be omitted.

As described above, according to the second embodiment, the image capture apparatus 100 can transmit control information to the cooling device 300, and the cooling device 300 can control power to be supplied to the cooling unit 303 based on the control information received from the image capture apparatus 100. Also, in a case where the power control method of the cooling device 300 is PWM control, when the image capturing unit 105 of the image capture apparatus 100 is performing an operation that is susceptible to a variation in magnetic field, it is possible to transmit, to the cooling device 300, control information for reducing the cooling capacity of the cooling device 300. The cooling device 300 can control power to be supplied to the cooling unit 303 so that the cooling capacity of the cooling unit 303 is reduced in accordance with the control information received from the image capture apparatus 100. With this, it is possible to cool the image capture apparatus 100 while reducing the effect on the image quality.

Third Embodiment

The third embodiment describes an example in which the image capture apparatus 100 determines whether or not to drive the cooling device 300 before the image capture apparatus 100 supplies power to the cooling device 300 to drive the cooling unit 303.

The accessory control unit 109 controls whether to drive the cooling device 300 (whether to supply power to the cooling device 300), based on temperature information relating to the temperature of the image capture apparatus 100 or operation information relating to the operation of the operation unit 104 that is acquired from the sub control unit 108.

Note that the present invention is not limited to the configuration in which the accessory control unit 109 controls the cooling device 300, and a configuration is also possible in which the main control unit 101 controls the cooling device 300.

The configurations of the image capture apparatus 100 and the cooling device 300 are the same as those of the first embodiment.

The following will describe the processing 600 that is executed in the image capture apparatus 100 according to the third embodiment, with reference to the flowchart of FIG. 6. The processing 600 is an example of processing for controlling the cooling device 300 connected to the image capture apparatus 100. In the processing 600, control is performed by the main control unit 101 executing a program stored in the memory of the main control unit 101. Note that FIG. 6 illustrates an example in which the power control method of the cooling device 300 is DC control or PWM control.

In the processing 600 in FIG. 6, the processing in steps S601 to S603, and S605 to S609 are the same as the processing in steps S401 to S403, and S404 to S408 of the processing 400 in FIG. 4. Accordingly, in the third embodiment, descriptions of steps S601 to S603 and S605 to S609 are omitted.

In step S604, the accessory control unit 109 determines whether or not to drive the cooling device 300. When the accessory control unit 109 determines that the cooling device 300 is to be driven, the accessory control unit 109 advances the processing 600 to step S605. When the accessory control unit 109 determines that the cooling device 300 is not to be driven, the accessory control unit 109 advances the processing 600 to step S609.

The accessory control unit 109 determines whether to drive the cooling device 300 with reference to, for example, the operation information of the operation unit 104, and drives the cooling device 300 when the user of the image capture apparatus 100 has made an operation to drive the cooling device 300.

The accessory control unit 109 determines whether to drive the cooling device 300 with reference to, for example, the temperature information from the temperature detection unit 113, and drives the cooling device 300 when the temperature information of the image capture apparatus 100 indicates a predetermined temperature or higher.

As described above, according to the third embodiment, it is possible to determine whether or not to drive the cooling device 300 based on the temperature information or the operation information of the image capture apparatus 100, before the image capture apparatus 100 supplies power to the cooling device 300 to drive the cooling unit 303. Also, when the user of the image capture apparatus 100 has made an operation to drive the cooling device 300 or the temperature information of the image capture apparatus 100 indicates a predetermined temperature or higher, it is possible to perform control such that the cooling device 300 is driven. With this, since the cooling device 300 can be driven only during a period in which the cooling device 300 is desired to be driven, it is possible to suppress the consumption of the battery 111 while reducing the adverse effect on the image quality.

Fourth Embodiment

The various functions, processing, or methods described in the above-described embodiment may also be realized by a computer of a device or an apparatus executing a program. In this case, the program is supplied to the computer of the device or the apparatus via a computer-readable storage medium. The computer-readable storage medium in the fourth embodiment includes, for example, a hard disk device, a magnetic storage device, an optical storage device, a magneto-optical storage device, a memory card, a volatile memory, or a nonvolatile memory. The computer-readable storage medium in the second embodiment is, for example, a non-transitory storage medium.

While the present invention has been described with reference to exemplary embodiments, it is to be understood that the invention is not limited to the disclosed exemplary embodiments. The scope of the following claims is to be accorded the broadest interpretation so as to encompass all equivalent structures and functions.

This application claims the benefit of Japanese Patent Application No. 2021-205460, filed Dec. 17, 2021 which is hereby incorporated by reference herein in its entirety.

What is claimed is:

1. An image capture apparatus comprising:
a connection interface that connects a cooling device; and
a controller that controls power for driving the cooling device,
wherein in a case where the power control method of the cooling device is a power control method that involves a variation in magnetic field, and the image capture apparatus is performing a predetermined operation in which image quality is changed in response to the variation in magnetic field,
the controller controls the power for driving the cooling device so as to reduce a cooling capacity of the cooling device.

2. The apparatus according to claim 1, wherein
the power control method includes a first power control method of linearly changing a voltage to be applied to the cooling device, and a second power control method of changing, using pulse width modulation, a period in which a voltage is applied to the cooling device, and
the controller performs control such that, in a case of the second power control method, a first power is supplied in a case where the cooling device is not performing the predetermined operation, and a second power, which is smaller than the first power, is supplied in a case where the image capture apparatus is performing the predetermined operation.

3. The apparatus according to claim 1, wherein the predetermined operation is an operation of reading an image signal from image capturing unit.

4. The apparatus according to claim 1, wherein the controller stops power supply to the cooling device in a case where it is not possible to determine the power control method of the cooling device.

5. The apparatus according to claim 1, wherein the controller transmits, to the cooling device, control information for controlling power for driving the cooling device based on the power control method of the cooling device.

6. The apparatus according to claim 1, wherein the controller determines whether to drive the cooling device before supplying power to drive the cooling device.

7. The apparatus according to claim 6, wherein the controller determines whether to drive the cooling device based on information relating to a temperature of the image capture apparatus.

8. The apparatus according to claim 6, wherein the controller determines whether to drive the cooling device based on information input from operation unit of the image capture apparatus.

9. The apparatus according to claim 1, further comprising
a detector that detects that the cooling device is connected,
wherein the controller controls the power for driving the cooling device in a case where the cooling device is connected to the image capture apparatus.

10. A method of controlling an image capture apparatus to which a cooling device can be connected, comprising:
controlling power for driving the cooling device,
wherein in a case where the power control method of the cooling device is a power control method that involves a variation in magnetic field, and the image capture apparatus is performing a predetermined operation in which image quality is changed in response to the variation in magnetic field,
the controlling controls the power for driving the cooling device so as to reduce a cooling capacity of the cooling device.

11. The method according to claim 10, wherein
the power control method includes a first power control method of linearly changing a voltage to be applied to the cooling device, and a second power control method of changing, using pulse width modulation, a period in which a voltage is applied to the cooling device, and
wherein
the controlling performs control such that, in a case of the second power control method, a first power is supplied in a case where the cooling device is not performing the predetermined operation, and a second power, which is smaller than the first power, is supplied in a case where the image capture apparatus is performing the predetermined operation.

12. The method according to claim 10, wherein the predetermined operation is an operation of reading an image signal from an image capturing unit.

13. The method according to claim 10, wherein the method further comprises
stopping power supply to the cooling device in a case where it is not possible to determine the power control method of the cooling device.

14. The method according to claim 10, wherein the method further comprises
transmitting, to the cooling device, control information for controlling power for driving the cooling device based on the power control method of the cooling device.

15. The method according to claim 10, wherein the method further comprises
determining whether to drive the cooling device before supplying power to drive the cooling device.

16. The method according to claim 15, wherein the method further comprises
determining whether to drive the cooling device based on information relating to a temperature of the image capture apparatus.

17. The method according to claim 15, wherein the method further comprises
determining whether to drive the cooling device based on information input from an operation unit of the image capture apparatus.

18. The method according to claim 10, wherein the method further comprises
detecting that the cooling device is connected,
wherein the controlling controls the power for driving the cooling device in a case where the cooling device is connected to the image capture apparatus.

19. A non-transitory computer-readable storage medium storing a program that causes a computer to execute a method of controlling an image capture apparatus to which a cooling device can be connected, comprising:
controlling power for driving the cooling device,
wherein in a case where the power control method of the cooling device is a power control method that involves a variation in magnetic field, and the image capture apparatus is performing a predetermined operation in which image quality is changed in response to the variation in magnetic field,
the controlling controls the power for driving the cooling device so as to reduce a cooling capacity of the cooling device.

* * * * *